(12) United States Patent
Katagiri et al.

(10) Patent No.: US 11,557,370 B2
(45) Date of Patent: Jan. 17, 2023

(54) SEMICONDUCTOR DEVICE AND SELF-DIAGNOSTIC METHOD OF SEMICONDUCTOR DEVICE

(71) Applicant: RENESAS ELECTRONICS CORPORATION, Tokyo (JP)

(72) Inventors: Daisuke Katagiri, Tokyo (JP); Terunori Kubo, Tokyo (JP); Hirotsugu Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 6 days.

(21) Appl. No.: 17/226,736

(22) Filed: Apr. 9, 2021

(65) Prior Publication Data

US 2022/0328123 A1 Oct. 13, 2022

(51) Int. Cl.
*G11C 29/00* (2006.01)
*G11C 29/50* (2006.01)
*G11C 7/10* (2006.01)

(52) U.S. Cl.
CPC ...... *G11C 29/50004* (2013.01); *G11C 7/1084* (2013.01); *G11C 2029/5004* (2013.01)

(58) Field of Classification Search
CPC ............ G11C 29/5004; G11C 29/1201; G11C 29/12015; G11C 7/1084; G11C 2029/5004; G11C 5/147
See application file for complete search history.

(56) References Cited

U.S. PATENT DOCUMENTS

| 5,196,788 | A  | * | 3/1993  | Cistulli ............ G01R 31/31926 714/736 |
| 9,838,028 | B1 |   | 12/2017 | Yamaguchi et al. |
| 2003/0006811 | A1 | * | 1/2003  | Oosawa ............ G01R 31/3172 327/113 |
| 2010/0313085 | A1 | * | 12/2010 | Tomiyama ............. G11C 29/16 714/718 |
| 2018/0082721 | A1 | * | 3/2018  | Okuma ............ G11C 29/12005 |

FOREIGN PATENT DOCUMENTS

JP 2017-208667 A 11/2017

* cited by examiner

*Primary Examiner* — Christine T. Tu
(74) *Attorney, Agent, or Firm* — McDermott Will & Emery LLP

(57) ABSTRACT

A semiconductor device includes an external terminal, an input buffer having an input terminal connected to the external terminal, a voltage generating circuit configured to generate a test voltage supplied to the input terminal, and a control circuit configured to determine whether the input buffer is deteriorated based on the test voltage supplied to the input terminal and an output level of the input buffer responding to the test voltage.

10 Claims, 13 Drawing Sheets

SEMICONDUCTOR DEVICE AND SELF-DIAGNOSTIC METHOD OF SEMICONDUCTOR DEVICE

BACKGROUND

The present disclosure relates to a semiconductor device, for example, the present disclosure is applicable to diagnosing deterioration of input buffers.

Generally, the micro controller unit (MCU) includes at least one CPU, at least one memory and peripheral circuits, and is constituted of Complementary Metal-Oxide Semiconductor (CMOS) circuits. The peripheral circuits include, for example, an input/output port (I/O port) (also referred to as an IO buffer) for transmitting signals between the CPU and an external circuit or an input-only port. The I/O port generally includes an output buffer for outputting a signal to an external terminal, an input buffer for inputting a signal of an external terminal, or the like. The input-only port includes an input buffer for inputting a signal of an external terminal, or the like.

When the I/O port is used as an input port, the signal transmitted from the external circuit to the external terminal of the MCU is transmitted to the input terminal (internal input terminal) of the input buffer. At this time, an enable signal IBE is applied to the other input terminal of the input buffer, and the input buffer is enabled. The input buffer of the I/O port or the input-only port recognizes the input signal as a high level (hereinafter, referred to as H level) when the input voltage becomes VIH (Input High Voltage) or higher, and recognizes the input signal as a low level (hereinafter, referred to as L level) when the input voltage becomes VIL (Input Low Voltage) or lower. Here, when the power supply potential of the input buffer is VDD and the ground potential is VSS, then VDD>VIH>VIL>VSS.

SUMMARY

The VIH/VIL characteristics of the input buffer deteriorate due to aging. Here, the VIH/VIL characteristic is a characteristic of a minimum value of VIH (VIHmin) or a maximum value of VIL (VILmax). Due to aging, VIHmin becomes higher or VILmax becomes lower.

If higher specifications of VIH/VIL or higher long-term reliability are required, deterioration of VIH/VIL characteristics of the input-buffer may become a problem. Here, the higher specification of VIH/VIL means a lower voltage for VIHmin and a higher voltage for VILmax.

Japanese Unexamined Patent Application Publication No. 2017-208667 discloses an A/D converter that detects changes in characteristics over time and corrects the converted digital signal based on the detection result.

Other objects and novel features will become apparent from the description of this specification and the accompanying drawings.

An outline of representative ones of the present disclosure will be briefly described below. That is, the semiconductor device performs self-diagnoses a deterioration based on the measured results or operating history of VIH/VIL characteristics of the input buffer.

DETAILED DESCRIPTION

Figure 1:
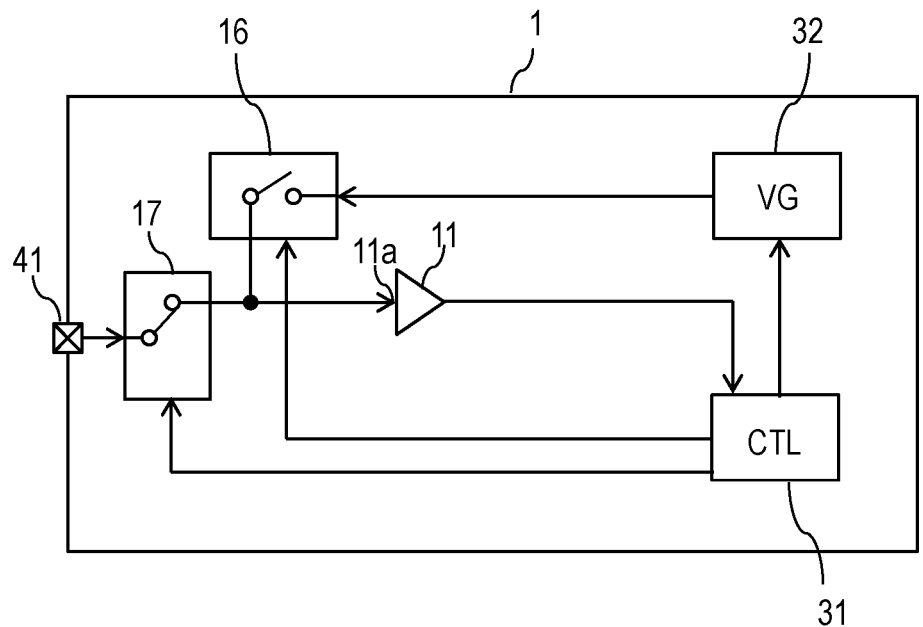
FIG. 1 is a diagram illustrating the configuration of semiconductor device according to the first embodiment.

Those Embodiments will be described below with reference to the drawings. For clarity of explanation, the following description and drawings are appropriately omitted and simplified. In the following description, the same components are denoted by the same reference numerals, and a repetitive description thereof may be omitted.

The semiconductor device of the embodiments diagnoses deterioration of the input buffer. In the first embodiment, the semiconductor device diagnoses the deterioration of the input buffer based on the measurement VIH/VIL characteristics of the input buffer. The semiconductor device in the second embodiment diagnoses deterioration of the input buffer based on the operation history of the input buffer.

First Embodiment

Figure 2:
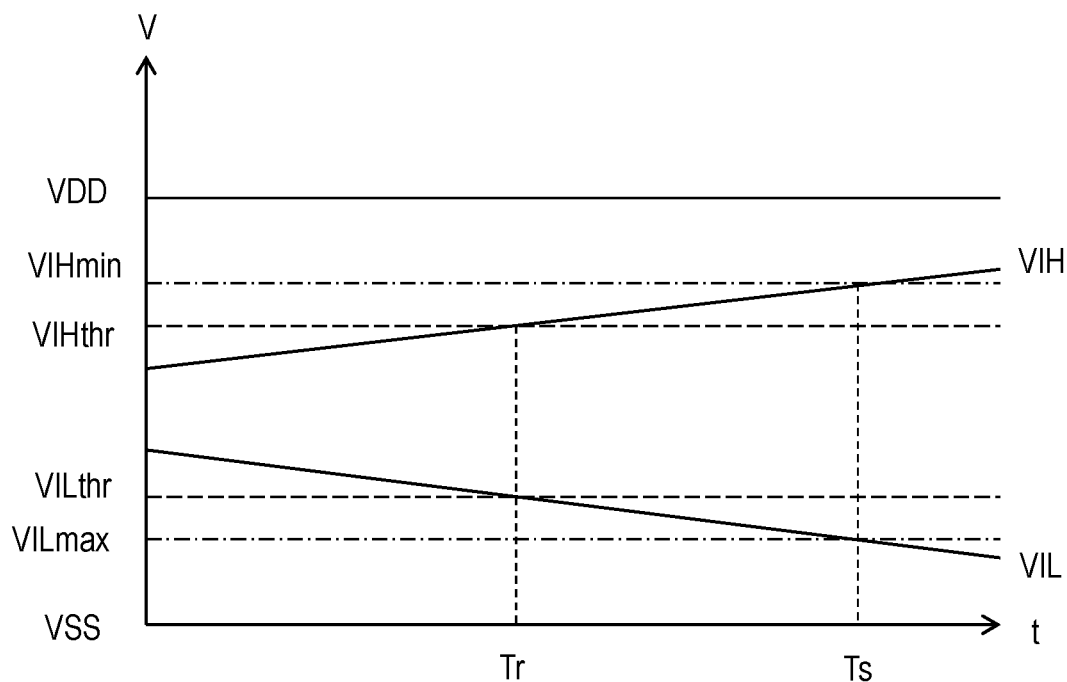
FIG. 2 is a diagram for explaining the characteristics of the input buffer shown in FIG. 1.

A semiconductor device according to first embodiment will be described with reference to FIGS. 1 and 2. FIG. 1 is a diagram illustrating the configuration of semiconductor device according to the first embodiment. FIG. 2 is a diagram for explaining the characteristics of the input buffer shown in FIG. 1.

As shown in FIG. 1, a semiconductor device 1 according to the first embodiment includes an input buffer 11, a switch 16, a switch 17, a control circuit (CTL) 31 and a voltage generating circuit (VG) 32.

The input buffer 11 has an input terminal 11a which is input a signal from the external terminal 41 via the switch 17. Here, when the signal input from the external terminal 41 is H level, the output of the input buffer 11 is H level. When the signal input from the external terminal 41 is L level, the output of the input buffer 11 is L level.

When a signal is input from the external terminal 41 to the input buffer 11, the control circuit 31 controls the switch 17 to conduct and the switch 16 to shut off.

When performing degradation diagnosis of the input buffer 11, the control circuit 31 disconnects the input buffer 11 from the external terminal 41 by shutting off the switch 17. Then, the control circuit 31 applies a test voltage to the input terminal 11a of the input buffer 11 from the voltage generating circuit 32 by conducting the switch 16. The control circuit 31 monitors the output level of the input buffer 11.

Next, the procedure for measuring and diagnosing VIH/VIL for the input buffer 11 will now be described. The control circuit 31 applies the test voltage to the input terminal 11a of the input buffer 11, and measures the input voltage at which the output level of the input buffer 11 is inverted. In the case of measurement of VIH, the control circuit 31 gradually increases the test voltage from the VSS side, and measures a voltage at which the output level of the input buffer 11 is inverted from the L level to the H level. In the case of measurement of VIL, the control circuit 31 gradually decreases the test voltage from the VDD side, and measures a voltage at which the output level of the input buffer 11 is inverted from the H level to the L level.

As shown in FIG. 2, when the deterioration of the input buffer progresses, the input voltage, which the input buffer 11 recognize as high level, becomes higher. The input voltage, which the input buffer 11 recognizes as low level, becomes lower. When VIH exceeds a predetermined voltage, for example, the threshold voltage (VIHthr) (VIH>VIHthr), the control circuit 31 determines that the input buffer 11 has deteriorated beyond a certain level. The threshold voltage (VIHthr) may be a minimum value (VIHmin) of the threshold voltage VIH. When VIL is lower than a predetermined voltage, for example, when the threshold voltage (VILthr) (VIL<VILthr), the control circuit 31 determines that the input buffer 11 has deteriorated beyond a certain level. The threshold voltage (VILthr) may be the maximum value (VILmax) of the threshold voltage VIL.

If it is determined that the input buffer 11 has deteriorated beyond the certain level, the control circuit 31, for example, issues an error.

In semiconductor device 1, a plurality of input buffers connected to the external terminal 41 may be provided to make the input buffers redundant. In this case, the control circuit 31 switches to another input buffer when it is determined that one input buffer has deteriorated beyond the certain level.

Analysis of the reliability assessment of semiconductor device by the present disclosers revealed that the deterioration of VIH/VIL characteristics of the input buffers corresponding to the terminals whose input level is mostly L level or H level is large. That is, the degree of aging degradation of the input buffer changes depending on the input state such as the input duty ratio. In particular, when the H level is input or the L level is input at all times, the aging degradation of the input buffer is accelerated.

It is considered that the deterioration of VIH/VIL characteristics of the input buffer described above is caused by NBTI (Negative Bias Temperature Instability) or PBTI (Positive Bias Temperature Instability) deterioration of the transistors constituting the input buffer. Here, NBTI is a phenomenon in which the threshold value (absolute value) of PMOS transistor increases when a voltage that is negative than the substrate voltage (the gate voltage at which the transistor is active state) is applied to the gate of PMOS transistor continues for a long time. PBTI is a phenomenon in which the threshold value (absolute value) of NMOS transistor increases when a voltage higher than the substrate voltage (the gate voltage at which the transistor is active state) is applied to the gate of NMOS transistor continues for a long time.

When the input period of the H level is long, the VIL characteristic deteriorates, and when the input period of the L level is long, the VIH characteristic deteriorates. On the other hand, if input of the L level is performed after input of the H level is continued for a long time, or input of the H level is performed after input of the L level is continued for a long time, some aging deterioration is recovered.

Therefore, in the first embodiment, a refresh circuit may be provided. In this case, when it is determined that one input buffer has deteriorated beyond the certain level, the control circuit 31 disconnects the input buffer 11 from the external terminal 41. Then, the control circuit 31, for example, refreshes the aging of the input buffer 11 using a refresh circuit having a pull-up circuit or a pull-down circuit or the like. Here, when the VIH characteristic of the input buffer 11 is deteriorated, the control circuit 31 inputs the H level to the input buffer 11 by the pull-up circuit and refreshes it. If the VIL characteristic of the input buffer 11 is deteriorated, the control circuit 31 inputs the L level to the input buffer 11 by the pull-down circuit and refreshes it. Further, a plurality of input buffers connected to the external terminal 41 may be provided to make the input buffers redundant. While one input buffer 11 is refreshed, the user may continue to operate by using a redundant input buffer.

Second Embodiment

Figure 3:
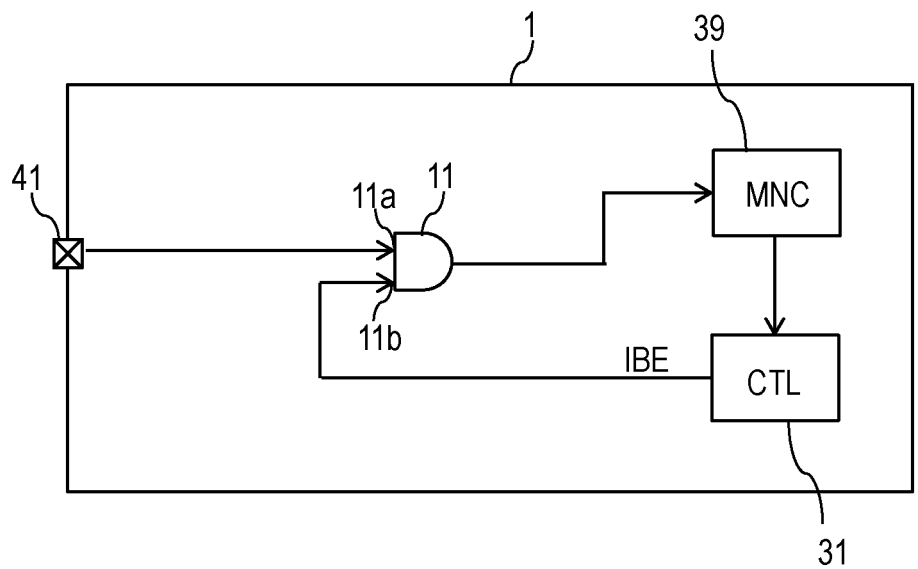
FIG. 3 is a diagram showing the configuration of semiconductor device in the second embodiment.
Figure 4:
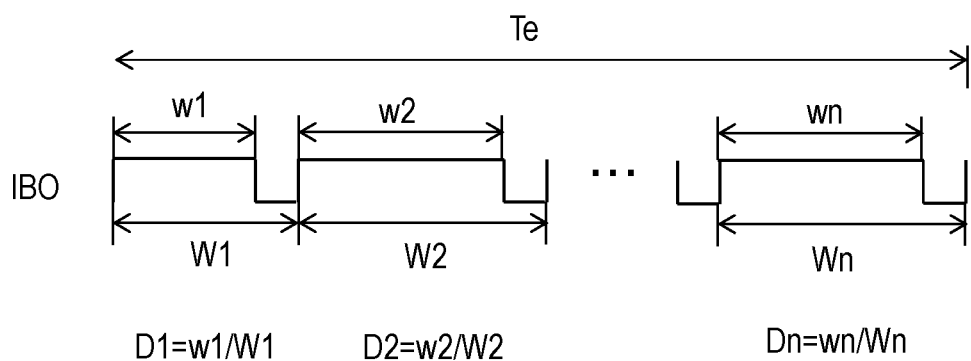
FIG. 4 is a diagram illustrating the operation of semiconductor device shown in FIG. 3.

The semiconductor device in the second embodiment will be described with reference to FIGS. 3 and 4. FIG. 3 is a diagram showing the configuration of semiconductor device in the second embodiment. FIG. 4 is a diagram for explaining the operation of the diagnostic circuit shown in FIG. 3.

As shown in FIG. 3, a semiconductor device 1 in the second embodiment includes an input buffer 11 and the control circuit (CTL) 31 and the monitor circuit (MNC) 39.

The input buffer 11 includes an input terminal 11a to which a signal from the external terminal 41 is input, and an input terminal 11b to which an enable signal (IBE) from the control circuit 31 is input. Here, the input buffer 11 may be, for example, an AND circuit. When the enable signal IBE is at the H level, the input buffer 11 is enabled. In this case, when the signal input from the external terminal 41 is H level, the output of the input buffer 11 is H level. When the signal input from the external terminal 41 is L level, the output of the input buffer 11 is L level.

The control circuit 31 acquires and stores the operation history of the input buffer by detecting the time (Te) of the input enable (IBE) of the input buffer 11 and the output duty ratio (D) of the input buffer 11 by the monitor circuit 39, and monitors the degree of deterioration.

The procedures of acquiring the operation history and diagnosing of the input buffer 11 will be described. The control circuit 31 acquires the input enable time (Te) of the input buffer 11 and the output duty ratio (D) of the input buffer 11 as the operation history of the input buffer. For example, if the semiconductor device 1 is a microcontroller, the input enable signal (IBE) is activated according to the software, then the input buffer is enabled. Therefore, the input enable time (Te) in which the input enable signal (IBE) is activated can be acquired by software by using, for example, a real-time clock (RTC) in the microcontroller.

The width (w1, w2, ..., wn) of the H level of the output of the input buffer 11 as shown in FIG. 4 and the width (W1, W2, ..., Wn) of one cycle are measured by the monitor circuit 39 having a timer counter or the like. As a result of the measurement, the control circuit 31 determines the output duty ratio of the input buffer 11 (D1, D2, ..., Dn). The control circuit 31 can measure the times of the H level and the L level of the input signal in the input buffer 11 by using the output duty ratio of the input enable time (Te) and the input buffer 11 (D1, D2, ..., Dn), These times are stored as the operation history of the input buffer 11. For example, if the semiconductor device 1 is a microcontroller, they stored into a non-volatile memory such as a built-in flash memory at any time or in power-off sequence.

The control circuit 31 determines that the input buffer has deteriorated beyond the certain level, when the H level period or L level period of the input signal at the input buffer 11 is a predetermined time, for example, it exceeds the degradation threshold time. Here, the deterioration threshold time is, for example, a time between Tr and Ts as shown in FIG. 2 acquired in the reliability evaluation. Here, Tr is a time when VIH reaches the threshold voltage (VIHthr) or VIL reaches the threshold voltage (VILthr). Ts is the time at which VIH reaches VIHmin or VIL reaches VILmax.

The control circuit 31 issues an error when it is determined that the deterioration of the input buffer 11 has progressed beyond the certain level.

In the second embodiment, similarly to the first embodiment, a plurality of input buffers connected to the external terminal 41 may be provided to multiplex the input buffer, or the refresh circuit may be provided.

According to these embodiments, the long-term reliability of semiconductor device's input-buffers is increased. In addition, margins corresponding to long-term reliability degradation among VIH/VIL variations can be reduced, and VIH/VIL specifications can be made higher.

The first to third examples, which are examples of the first embodiment, will be described below.

First Example

Figure 5:
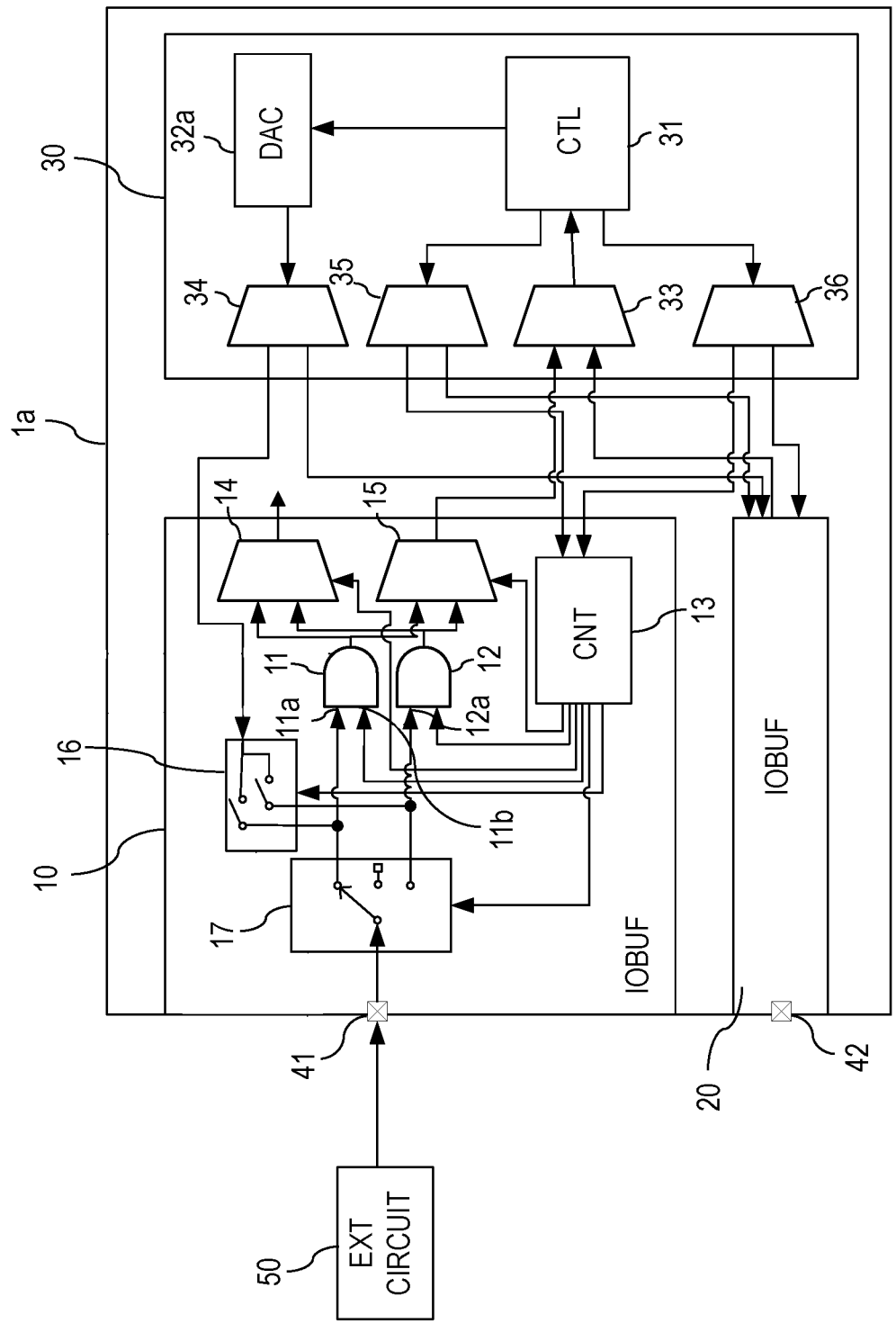
FIG. 5 is a diagram showing the configuration of the microcontroller in the first example.

The configuration of the microcontroller, the operation of the I/O buffers, and the operation of the deterioration diagnostic circuits in the first example will be described with reference to FIG. 5. FIG. 5 is a diagram showing the configuration of the microcontroller in the first example.

A microcontroller 1a as a semiconductor device is formed, for example, on a semiconductor substrate (semiconductor chip), such as monocrystalline silicon, using a known CMOS fabrication process. The microcontroller 1a has IO buffers 10 and 20 and a diagnostic circuit 30 for diagnosing deterioration of the input buffer.

The IO buffer 10 includes multiplexed input buffers 11 and 12, a control circuit (CNT) 13, multiplexers 14 and 15 as selectors, a switch 16, and a switch 17. The IO buffer 10 may further include an output buffer (not shown), or may include a pull-up circuit and/or a pull-down circuit.

The input buffers 11 and 12 are circuits to be diagnosed. The input buffer 11 includes an input terminal 11a to which a signal from the external terminal 41 is input, and an input terminal 11b to which an enable signal (IBE) from the control circuit 13 is input. Here, the input buffer 11 may be, for example, an AND circuit. When the enable signal IBE is at the H level, the input buffer 11 is enabled. In this case, when the signal input from the external terminal 41 is H level, the output from the input buffer 11 is H level. When the signal input from the external terminal 41 is L level, the output of the input buffer 11 is L level. The input buffer 12 has a configuration similar to that of the input buffer 11.

The control circuit 13 controls input buffers 11 and 12, multiplexers 14 and 15, the switch 16, and the switch 17. The multiplexers 14 and 15 select the output of the input buffer 11 and 12 based on the control signal from the control circuit 13.

The switch 16 connects the output of the diagnostic circuit 30 to the input terminal 11a of the input buffer 11 or the input terminal 12a of the input buffer 12. The switch 17 connects the external terminal 41 to the input terminal 11a of the input buffer 11 or the input terminal 12a of the input buffer 12. The switch 17 may connect the external terminal 41 to neither the input terminal 11a of the input buffer 11 nor the input terminal 12a of the input buffer 12. The IO buffer 10 is connected to an external circuit 50 via an external terminal 41.

The diagnostic circuit 30 includes a control circuit (CTL) 31, a digital to analog (D/A) converter (DAC) 32a as a voltage generating circuit. Here, the control circuit 31 may be a dedicated circuit, or may be a CPU and a memory incorporated in the microcontroller 1a. The control circuit 31 controls the D/A converter 32a and the control circuit 13 of the IO buffer 10.

When diagnosing a plurality of IO buffers, for example, the IO buffers 10 and 20, the diagnostic circuit 30 may also include a multiplexer 33 and demultiplexers 34-36. The control circuit 31 controls the control circuits of the IO buffers 10 and 20 via the demultiplexers 35 and 36. When the IO buffer 20 is the target of deterioration diagnosis, the IO buffer 20 has the same configuration as the IO buffer 10.

Next, the operation of the IO buffer 10 will be described. For example, when diagnosing the deterioration of the input buffer 11, the IO buffer 10 is controlled as described below by control signals input from the control circuit 31 of the diagnostic circuit 30 to the control circuit 13 of the IO buffer 10 via the demultiplexers 35 and 36.

The control circuit 13 disconnects the connection between the external terminal 41 and the input terminal 11a of the input buffer 11 by the switch 17. The control circuit 13 connects the input terminal 11a of the input buffer 11 and the output of the D/A converter 32a of the diagnostic circuit 30 by the switch 16. The output of the input buffer 11 is selected by a multiplexer 15 controlled by the control circuit 13. The output of the selected input buffer 11 is transmitted to the control circuit 31 via the multiplexer 33 of the diagnostic circuit 30.

Further, the control circuit 13 controls the switch 17 to open the external terminal 41, or to connect the external terminal 41 to the input terminal 12a of the input buffer 12. When the control circuit 13 controls the switch 17 to connect the external terminal 41 and the input terminal 12a of the input buffer 12, the signal from the external terminal 41 can be transmitted to the internal circuit (not shown) of the microcontroller 1a via the input buffer 12 and the multiplexer 14. Therefore, while diagnosing the deterioration of the input buffer 11, the signal supplied from the external terminal 41 may be transmitted to the internal circuit via the input buffer 12 (not shown).

Next, the operation of the diagnostic circuit 30 will be described. For example, when diagnosing the deterioration of the VIL characteristic of the input buffer 11, the control circuit 31 of the diagnostic circuit 30 outputs a control signal necessary for diagnosing the input buffer 11 of the IO buffer 10, as described above. Further, the control circuit 31 transmits the output of the D/A converter 32a to the input buffer 11 via the switch 16 in the IO buffer 10, and receives the output of the input buffer 11 at that time via the multiplexer 15.

The control circuit 31 compares the output voltage of the D/A converter 32a (test voltage) when the input buffer 11 recognized as L level with the threshold for determining that the input buffer 11 is deteriorated (degradation threshold). When the test voltage is lower than the deterioration threshold, the control circuit 31 determines that the input buffer 11 is deteriorated. In this case, for example, the control circuit 31 issues a control signal instructing to use the input buffer 12 to the control circuit 13 of the IO buffer 10. The control circuit 31 has a memory for storing a deterioration threshold value, a determination result, and the like. The memory may be provided external to the control circuit 31. For example, the memory may be provided within the diagnostic circuit 30, outside the diagnostic circuit 30, within the microcontroller 1a, or outside the microcontroller 1a.

Figure 6:
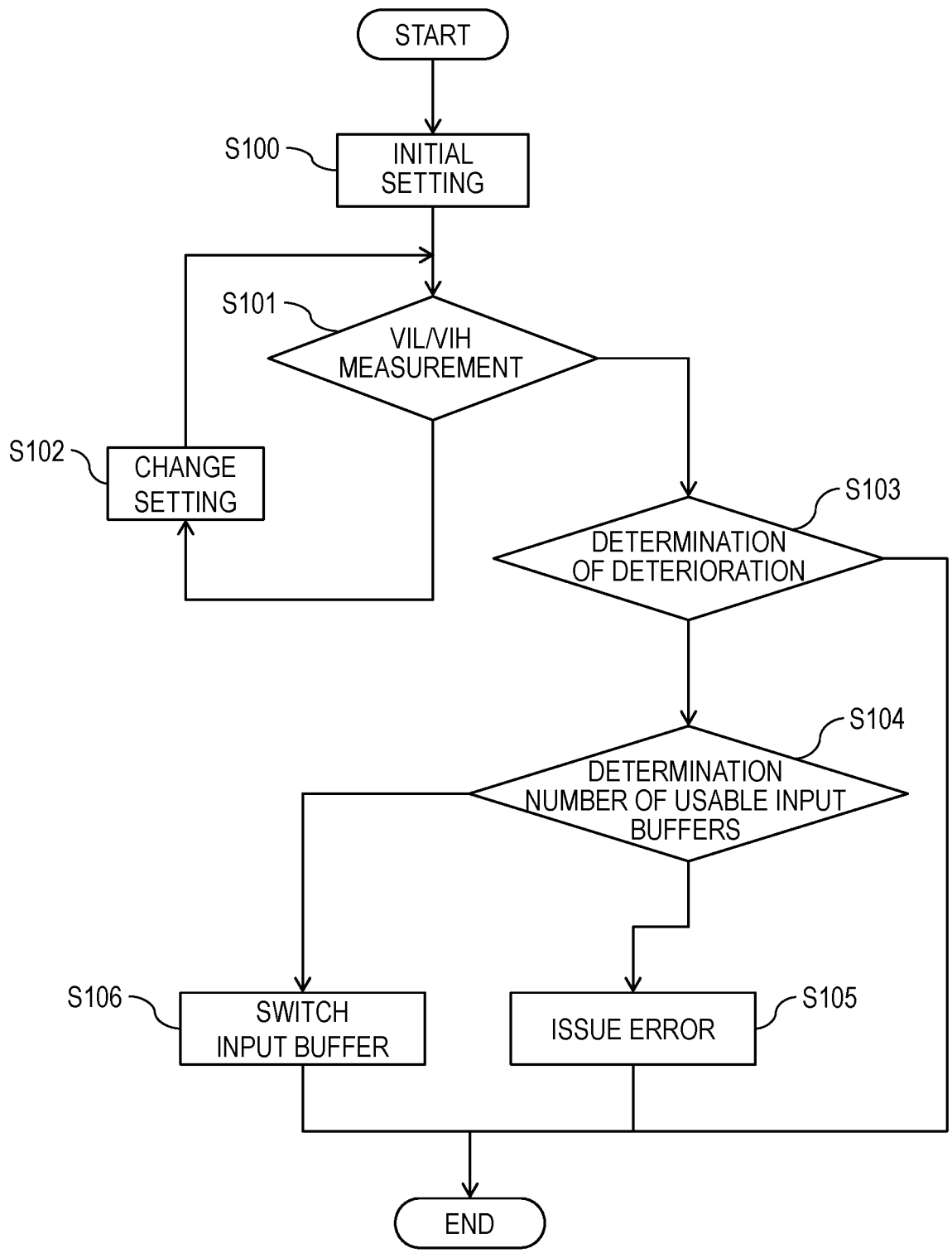
FIG. 6 is a flowchart showing an example of the operation of the microcontroller shown in FIG. 5.

Next, the operation of the microcontroller 1a relating to the control of the deterioration diagnosis on the input buffer will be described with reference to FIG. 6. FIG. 6 is a flowchart showing an example of the operation of the microcontroller shown in FIG. 5. The processes of controlling the deterioration diagnosis shown in FIG. 6 are performed, for example, at the time of starting the microcontroller 1a, but may be performed at another predetermined timing.

(Initial Setting: S100)

Based on the instruction of the control circuit 31, the control circuit 13 controls the switch 17 to disconnect the connection between the external terminal 41 and the input terminal 11a of the input buffer 11, which is an input buffer to be measured. Then, the control circuit 13 connects the input terminal 11a of the input buffer 11 to the output of the D/A converter 32a by using the switch 16. Then, the control circuit 31 sets the deterioration threshold and the number of other usable input buffers. Since the number of usable input buffers changes depending on the result of the deterioration diagnosis, the control circuit 31 stores the number in the nonvolatile memory, reads the number at the time of startup or the like, and sets the number in the nonvolatile memory.

Then, the control circuit 31 changes the setting of the D/A converter 32a according to whether to measure VIH/VIL of the input buffer 11. The control circuit 31, in the case of VIH measurement, sets the output of the D/A converter 32a to the offset voltage. On the other hand, the control circuit 31, in the case of VIL measurement, sets the output of the D/A converter 32a to the full-scale voltage.

(VIH/VIL Measurement: S101)

The control circuit 31 checks the output level of the input buffer 11. In the case of VIH measurement, when the input buffer 11 does not recognize the output of the input D/A converter 32a as the H level and the output level of the input buffer 11 indicates the L level, the processing advances to a step S102. On the other hand, when the input buffer 11 recognizes the output of the input D/A converter 32a as the H level and the output level of the input buffer 11 indicates the H level, the processing advances to a step S103. Further, in the case of VIL measurement, when the input buffer 11 does not recognize the output of the input D/A converter 32a as L level and the output level of the input buffer 11 indicates H level, the processing advances to the step S102. On the other hand, when the input buffer 11 recognizes the output of the input D/A converter 32a as L level and the output level of the input buffer 11 indicates L level, the processing advances to the step S103.

(Change Setting: S102)

In the case of VIH measurement, the control circuit 31 performs setting change so as to increase the output voltage of the D/A converter 32a. Further, in the case of VIL measurement, the control circuit 31 performs setting change so as to reduce the output voltage of the D/A converter 32a. Then, the control circuit 31 transits to the step S101 after the change of the output of the D/A converter 32a is completed.

(Determination of Deterioration: S103)

In the case of VIH measurement, the control circuit 31 determines whether the output voltage of the D/A converter 32a exceeds the deterioration threshold. If the control circuit 31 determines that the output voltage of the D/A converter 32a exceeds the degradation threshold, then the processing advances to the step S104. Further, when the output voltage of the D/A converter 32a does not exceed the deterioration threshold, the control circuit 31 determines that the input buffer 11 is not deteriorated, and terminates the deterioration diagnosis. In the case of VIL measurement, the control circuit 31 determines whether the output voltage of the D/A converter 32a is lower than the deterioration threshold. If the control circuit 31 determines that the output voltage of the D/A converter 32a is lower than the degradation threshold, then the processing advances to the step S104. Further, when the output voltage of the D/A converter 32a is equal to or higher than the deterioration threshold, the control circuit 31 determines that the input buffer is not deteriorated, and terminates the deterioration diagnosis.

(Determination of the Number of Usable Input Buffers: S104)

The control circuit 31 determines whether or not there is at least one usable input buffers which is not deteriorated. If the control circuit 31 determines that there is at least one the usable input buffer that is not deteriorated, the processing advances to the step S106. When there are no usable input buffers that are not deteriorated, the control circuit 31 shifts to the step S105.

(Switching to Input Buffers: S105)

The control circuit 31 performs switching to the input buffer 12 as the usable input buffer, for example. In addition, the control circuit 31 decreases the number of usable input buffers by one, and ends the deterioration diagnosis.

(Issue of Errors: S106)

The control circuit 31 issues an error and ends the deterioration diagnosis.

According to the first example, one or more of the following effects are achieved.

(1) By using the D/A converters to measure the level of VIH/VIL, the microcontroller can directly and accurately self-diagnose the deterioration of the level of VIH/VIL of the input-buffer.

(2) By providing the input buffer redundant in the IO buffer so that the other input buffer can be connected to the external terminal during self-diagnosis, the operation can be continued through the other input buffer even at the time of self-diagnosis.

(3) By providing the diagnostic circuit so that it can be used for self-diagnosis of a plurality of IO buffers, it is possible to suppress an increase in the area of the microcontroller.

Second Example

Figure 7:
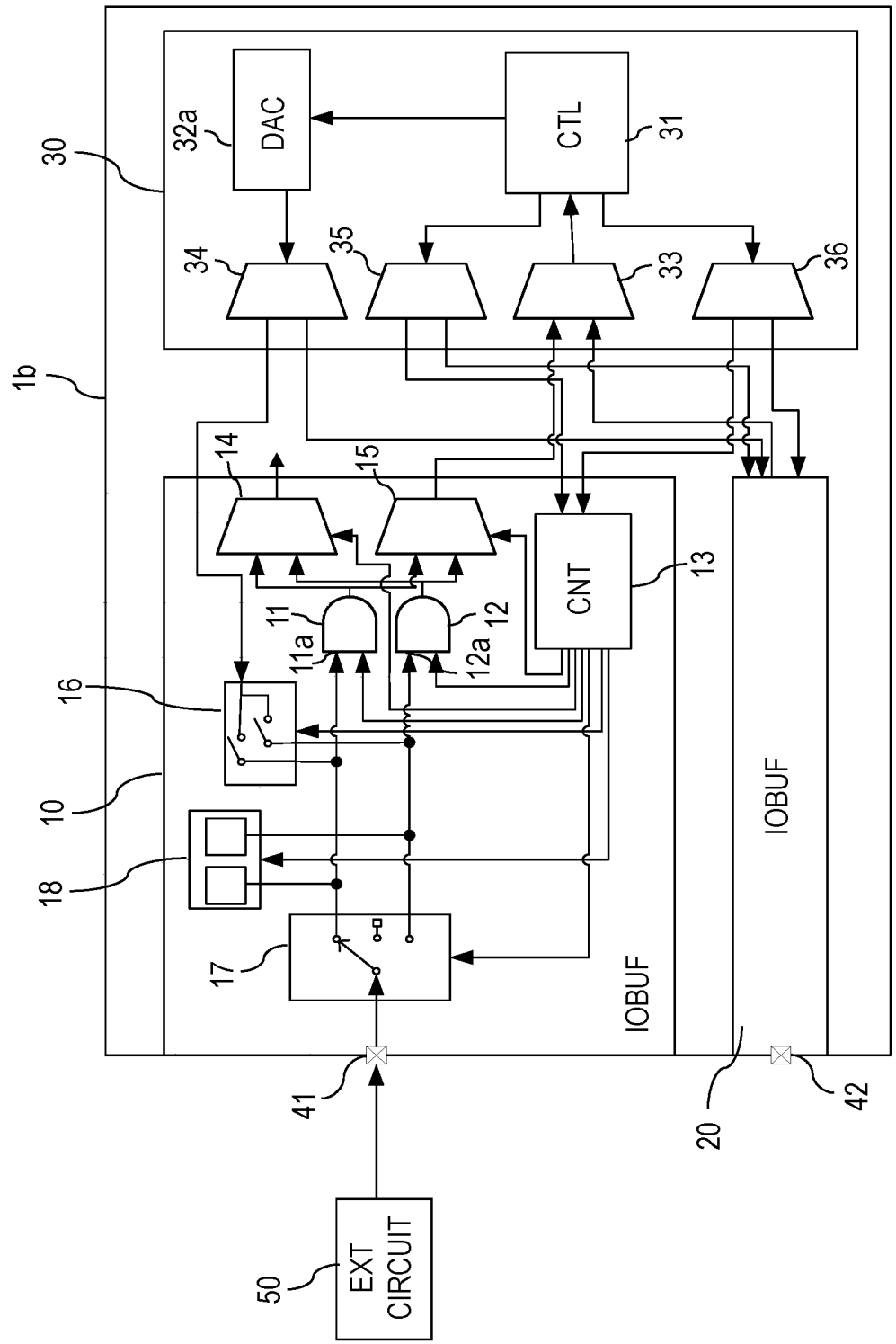
FIG. 7 is a diagram showing the configuration of the microcontroller in the second example.

The configuration of the microcontroller and the operation of the I/O buffers in the second example will be described with reference to FIG. 7. FIG. 7 is a diagram showing the configuration of the microcontroller in the second example.

In addition to the configuration of the first example, the microcontroller 1b according to the second example has refresh circuits 18 in the I/O buffers. Hereinafter, differences from the first example will be described, and descriptions of the same points as those of the first example will be omitted.

A refresh circuit 18 is connected to the input terminal 11*a* of the input buffer 11 and the input terminal 12*a* of the input buffer 12. Further, the control circuit 13 controls the refresh circuit 18 based on a control signal relating to the refresh circuit 18 from the control circuit 31 of the diagnostic circuit 30. The control circuit 13 may simply transmit the control signal of the refresh circuit 18 from the control circuit 31 to the refresh circuit 18.

For example, when it is determined that the input buffer 11 is deteriorated as a result of the deterioration diagnosis of the input buffer 11, the control circuit 13 continues to disconnect the connection between the input buffer 11 and the external terminal 41 by the switch 17, and turns off the switch 16. The control circuit 13 enables the refresh circuit 18 in this state and recovers the deterioration of the input buffer 11. The refresh circuit 18 includes, for example, a pull-up circuit and a pull-down circuit. The pull-up circuit supplies a voltage for turning off the gate of PMOS transistor connected to the input terminal of the input buffer. The pull-down circuit supplies a voltage for turning off the gate of NMOS transistor to the input buffer 11.

Figure 8:
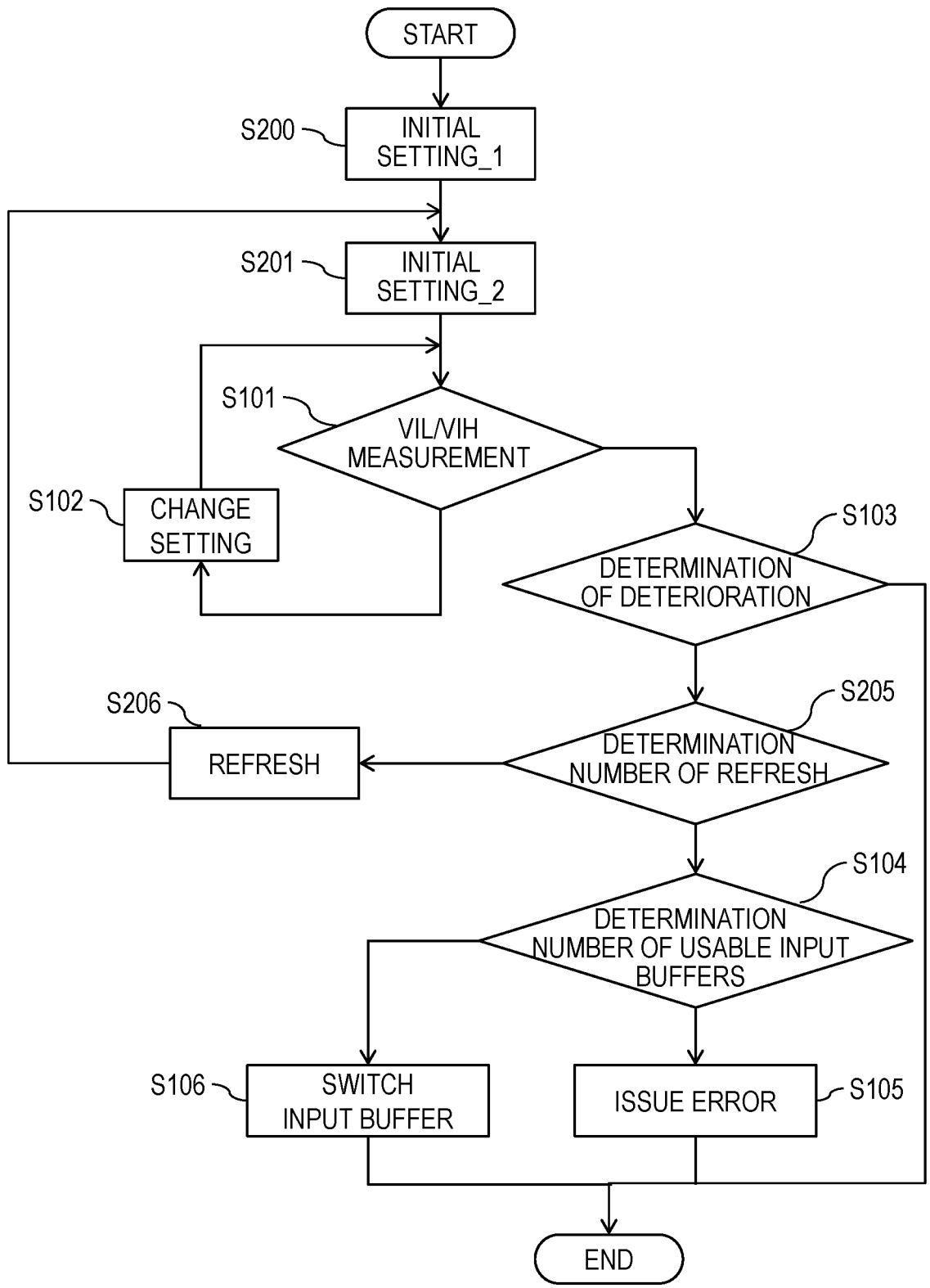
FIG. 8 is a flowchart showing an example of the operation of the microcontroller shown in FIG. 7.

Next, an operation related to the control of the input buffer degradation diagnosis in the microcontroller 1*b* will be described with reference to FIG. 8. FIG. 8 is a flowchart showing an example of the operation of the microcontroller shown in FIG. 7.

Since the degradation diagnoses in the microcontroller 1*b* are the same as those in the first example except for the steps S200, S201, S205 and S206, although the destinations of the transitions are different, the explanation thereof is omitted.

(Initial Setting_1: S200)

The control circuit 31 controls the switch 17 to disconnect the connection between the input buffer 11 as an input buffer to be measured and the external terminal 41. Then, the control circuit 31 sets the deterioration threshold, the remaining number of usable input buffers, the number of refreshes, and the refresh upper limit value. Since the number of usable input buffers and the number of refreshes vary depending on the result of the deterioration diagnosis, the control circuit 31 stores them in the nonvolatile memory, and reads and sets them at the time of startup or the like.

(Initial Setting_2: S201)

The control circuit 31 connects the input terminal 11*a* of the input buffer 11 to the output of the D/A converter 32*a* by using the switch 16. The control circuit 31 changes the settings of the D/A converters 32*a* according to which of VIH/VIL diagnostics is to be performed. In the case of VIH measurement, the control circuit 31 sets the output of the D/A converter 32*a* to the offset voltage. On the other hand, in the case of VIL measurement, the control circuit 31 sets the output of the D/A converter 32*a* to the full-scale voltage.

(Determination of Number of Refreshes: S205)

The control circuit 31 determines whether or not the number of refreshes exceeds the refresh upper limit value. When the number of refreshes exceeds the refresh upper limit value, the control circuit 31 shifts to the step S104. When the number of refreshes does not exceed the refresh upper limit value, the controller 31 shifts to the step S206.

(Refresh: S206)

The control circuit 13, based on an instruction of the control circuit 31, disconnects the connection between the input terminal 11*a* of the input buffer 11 and the output of the D/A converter 32*a* by using the switch 16. Further, the control circuit 13 enables the refresh circuit 18, performs refreshing of the input buffer 11. In addition, the control circuit 31 increases the information of the number of refreshes once. After the refresh is completed, the control circuit 31 shifts to the step S201.

In the second example, in addition to the first example, the refresh circuit 18 can be used to restore and reuse deterioration of the input buffers.

Third Example

Figure 9:
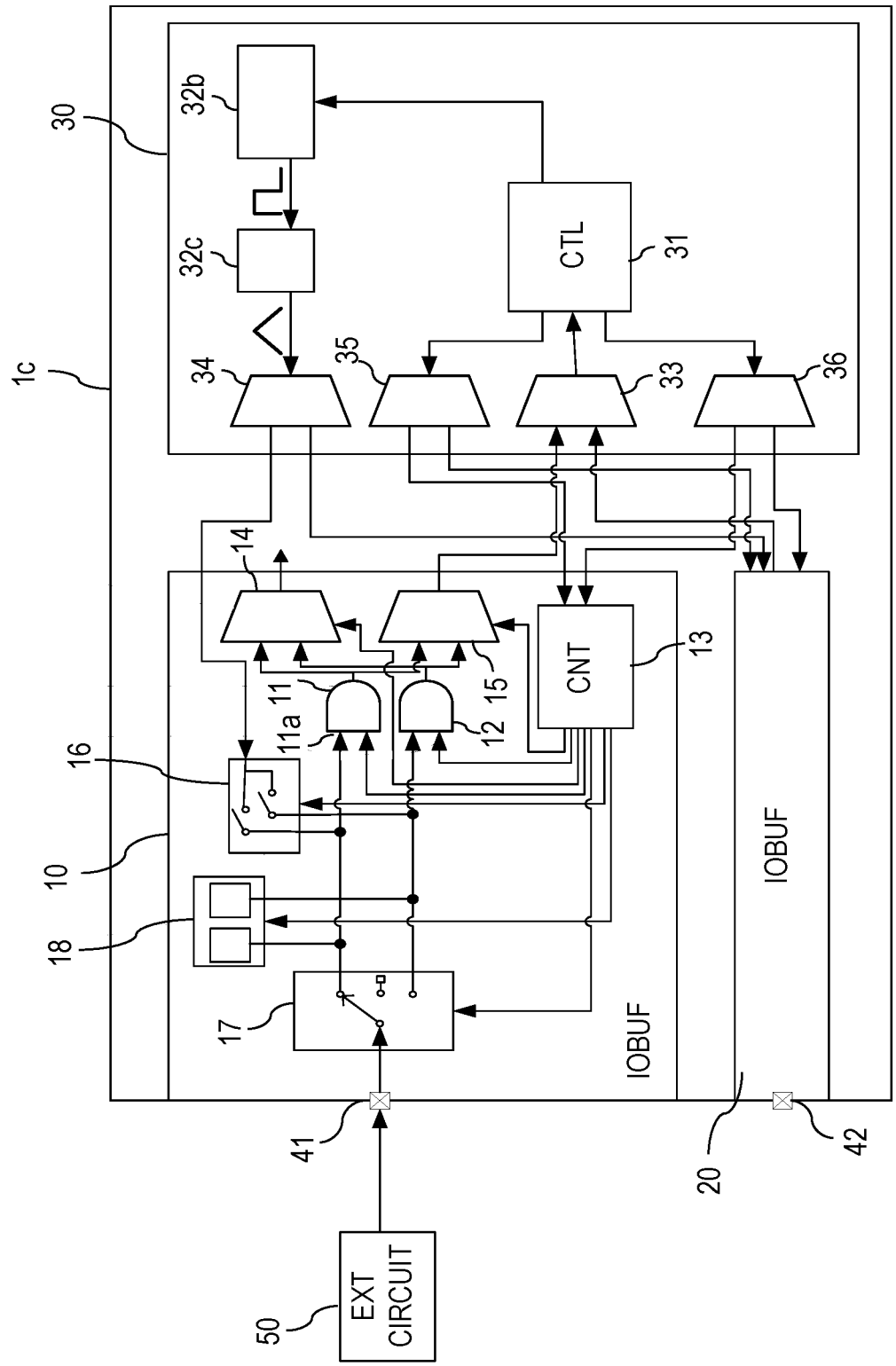
FIG. 9 is a diagram showing the configuration of the microcontroller in the third example.
Figure 10:
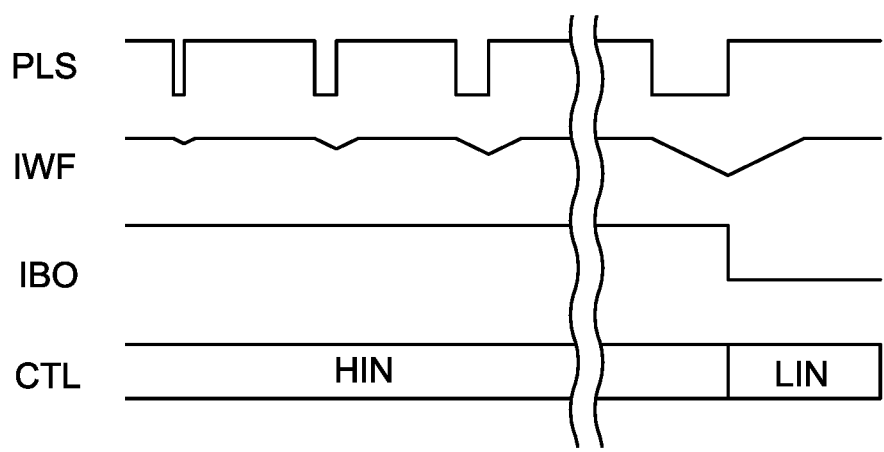
FIG. 10 is a diagram showing an example with respect to the relationship between the output waveform of the input buffer and the output waveform of the voltage generating circuit shown in FIG. 9 during VIL measurement.

The configuration of the microcontroller and the operation of the diagnostic circuit in the third example will be described with reference to FIGS. 9 and 10. FIG. 9 is a diagram showing the configuration of the microcontroller in the third example. FIG. 10 is a diagram showing a VIL measurement as an example for the relationship between the output of the waveform and the input buffer generated by the voltage generating circuit shown in FIG. 9.

As shown in FIG. 9, in the microcontroller 1*c* of the third example, the diagnostic circuit 30 includes a voltage generating circuit instead of the D/A converter in the second example. The voltage generating circuit includes a pulse generating circuit (PGC) 32*b* and an integrating circuit (IC) 32*c*. Like the first example, refresh circuits may not be provided. Hereinafter, differences from the second example will be described, and descriptions of the same points as those of the second example will be omitted.

The pulse generating circuit 32*b* generates a pulse signal (PLS) with any duty ratio and the same voltage amplitude as the input buffers 11 and 12. The integrating circuit 32*c* converts the pulse generated by the pulse generating circuit 32*b* (PLS) to an integral waveform (IWF) which is a voltage of a waveform equal to the time integration of the waveform of the voltage of the pulse, to output to the IO buffers 10 and 20. The integrating circuit 32*c* is, for example, constituted by a combination of capacitance and resistance.

Next, the operation of the diagnostic circuit 30 will be described. As shown in FIG. 10, the recess of the integral waveform (IWF) generated by the integrating circuit 32*c* as the width of the L level of the pulse generated by the pulse generating circuit 32*b* (PLS) is increased is increased, the voltage level is lowered. The integral waveform (IWF) is supplied to the input terminal 11*a* of the input buffer 11. If the width of the L level of the pulse (PLS) is small, the input buffer 11 recognizes the voltage level of the integral waveform (IWF) as H level, the output of the input buffer 11 (IBO) indicates H level. When the width of the L level of the pulse (PLS) is increased, the input buffer 11 recognizes the voltage level of the integral waveform (IWF) as L level, the output of the input buffer 11 (IBO) becomes L level. The control circuit 31 (CTL) determines whether the input voltage of the input buffer is H level input (HIN) or L level input (LIN) based on the H level or the L level of the output (IBO) of the input buffer.

Figure 11:
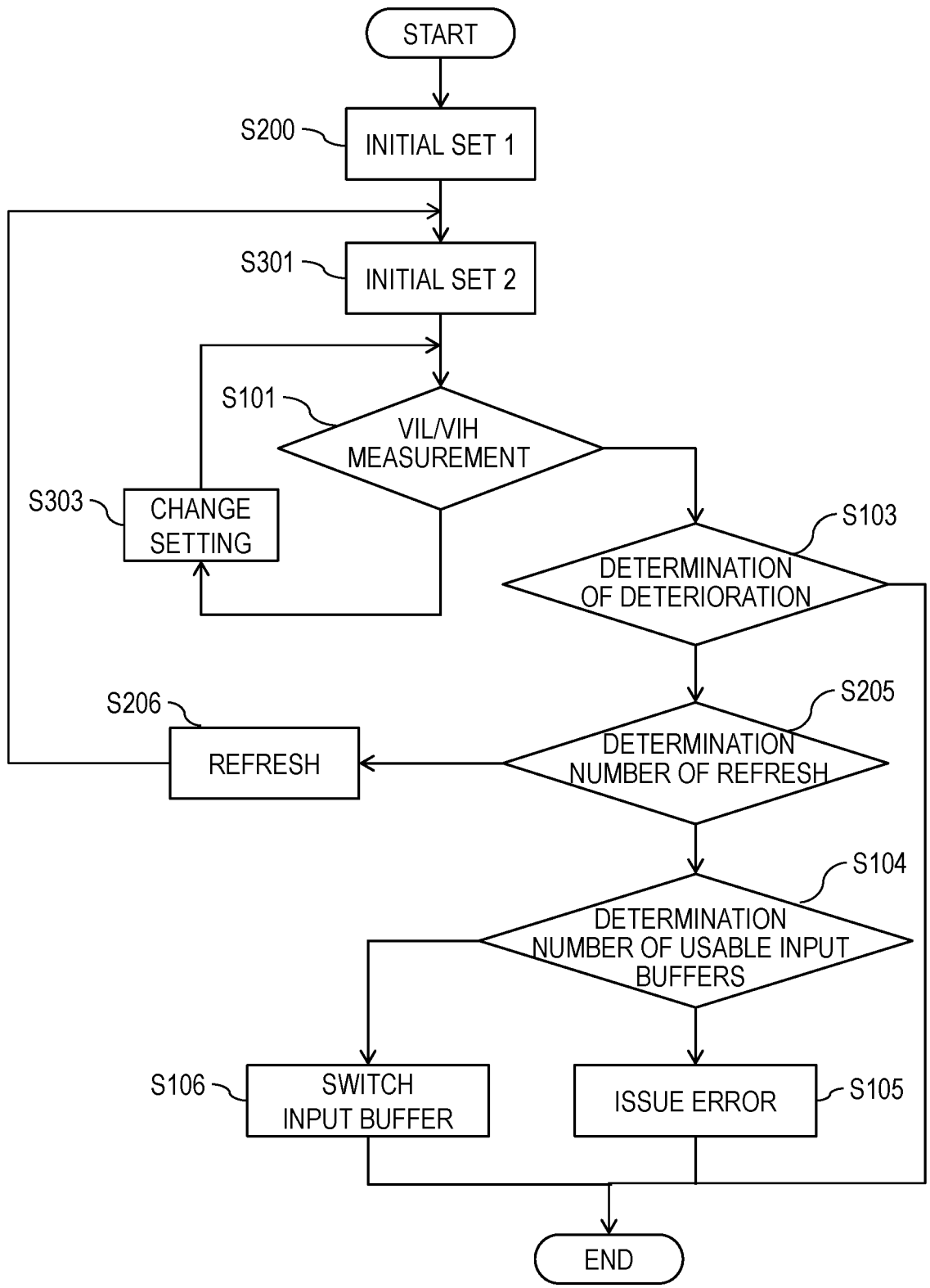
FIG. 11 is a flowchart showing an example of the operation of the microcontroller shown in FIG. 9.

The operation relating to the control of the input buffer degradation diagnosis in the microcontroller 1*c* will be described with reference to FIG. 11. FIG. 11 is a flowchart showing an example of the operation of the microcontroller shown in FIG. 9.

Since the input buffer degradation diagnoses in the microcontroller 1*c* are the same as those in the second example except for the steps S301-S303, descriptions thereof are omitted.

(Initial Setting 2: S301)

The control circuit 31 connects the input terminal 11*a* of the input buffer 11 to the output of the integrating circuit 32*c* by controlling the switch 16 The control circuit 31 changes the setting of the pulse generating circuit 32*b* in accordance with which of VIH/VIL diagnoses is to be performed. In the case of VIH measurement, the control circuit 31 sets the output duty ratio of the pulse generating circuit 32b to minimum. On the other hand, in the case of VIL measurement, the control circuit 31 sets the output duty ratio of the pulse generating circuit 32b to maximum.

(Change Setting: S303)

In the case of VIH measurement, the control circuit 31 changes the setting of the pulse generating circuit 32b so as to increase the output duty ratio. Further, in the case of VIL measurement, the control circuit 31 changes the setting of the pulse generating circuit 32b so that the output duty ratio is reduced. After the change of the output duty ratio of the pulse generating circuit 32b is completed, the processing returns to the step S101.

In the third example, in place of the D/A converter of the second example, by using the pulse generating circuit and the integrating circuit as a voltage generating circuit, it is possible to reduce the circuit area.

The fourth example and the fifth example, which are examples of the second embodiment, will be described below.

Fourth Example

Figure 12:
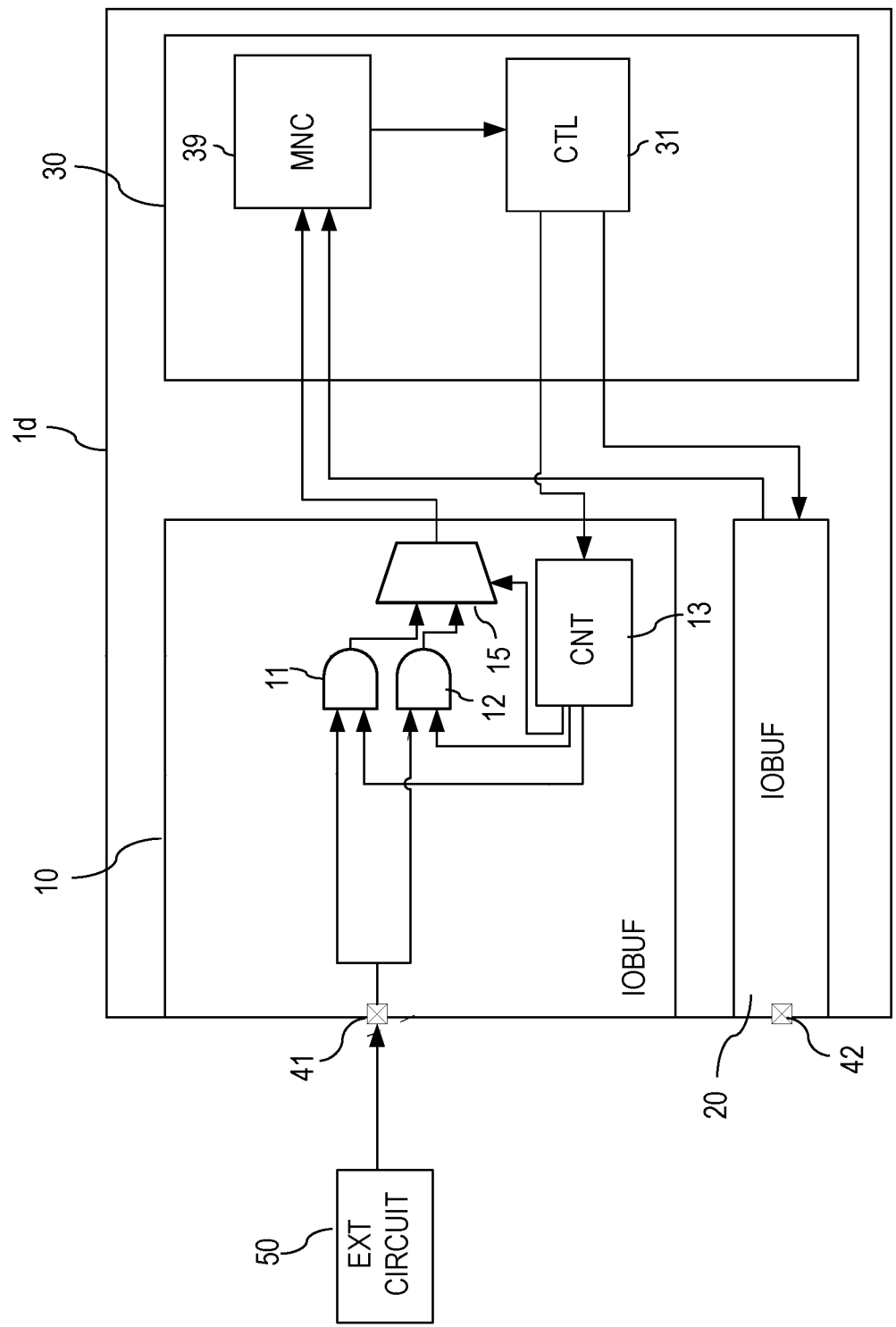
FIG. 12 is a diagram showing the configuration of the microcontroller in the fourth example.

The configuration of the microcontroller and the operation of the diagnostic circuit in the fourth example will be described with reference to FIG. 12. FIG. 12 is a diagram showing the configuration of the microcontroller in the fourth example.

In the microcontroller 1d in the fourth example include a monitor circuit (MNC) 39 instead of the switch 17 and the switch 16 and the D/A converter 32a of the first example. Also, the multiplexers 14 and 33 and demultiplexers 34-36 are not provided. Hereinafter, differences from the first example will be described, and descriptions of the same points as those of the first example will be omitted.

The IO buffer 10 includes multiplexed input buffers 11 and 12 and a control circuit 13. The diagnostic circuit 30 includes a control circuit 31 and the monitor circuit 39.

The monitor circuit 39, similarly to the second embodiment, monitors the output duty ratio of the input buffer. The monitor circuit 39 monitors the input buffer of the IO buffer 20 in addition to the input buffer of the IO buffer 10.

The control circuit 31, similarly to the second embodiment, calculates the accumulated time of L level or the H level of the input signal in the input buffer 11 based on the accumulated input enable time and the output duty ratio. The control circuit 31 determines that the input buffer 11 as the diagnosis target has deteriorated, when the accumulated time of L level or the H level of the input signal exceeds the preset threshold (degradation threshold). The control circuit 31 issues a control signal to the control circuit 13 of the IO buffer 10 in order to use the input buffer 12 which is available.

Figure 13:
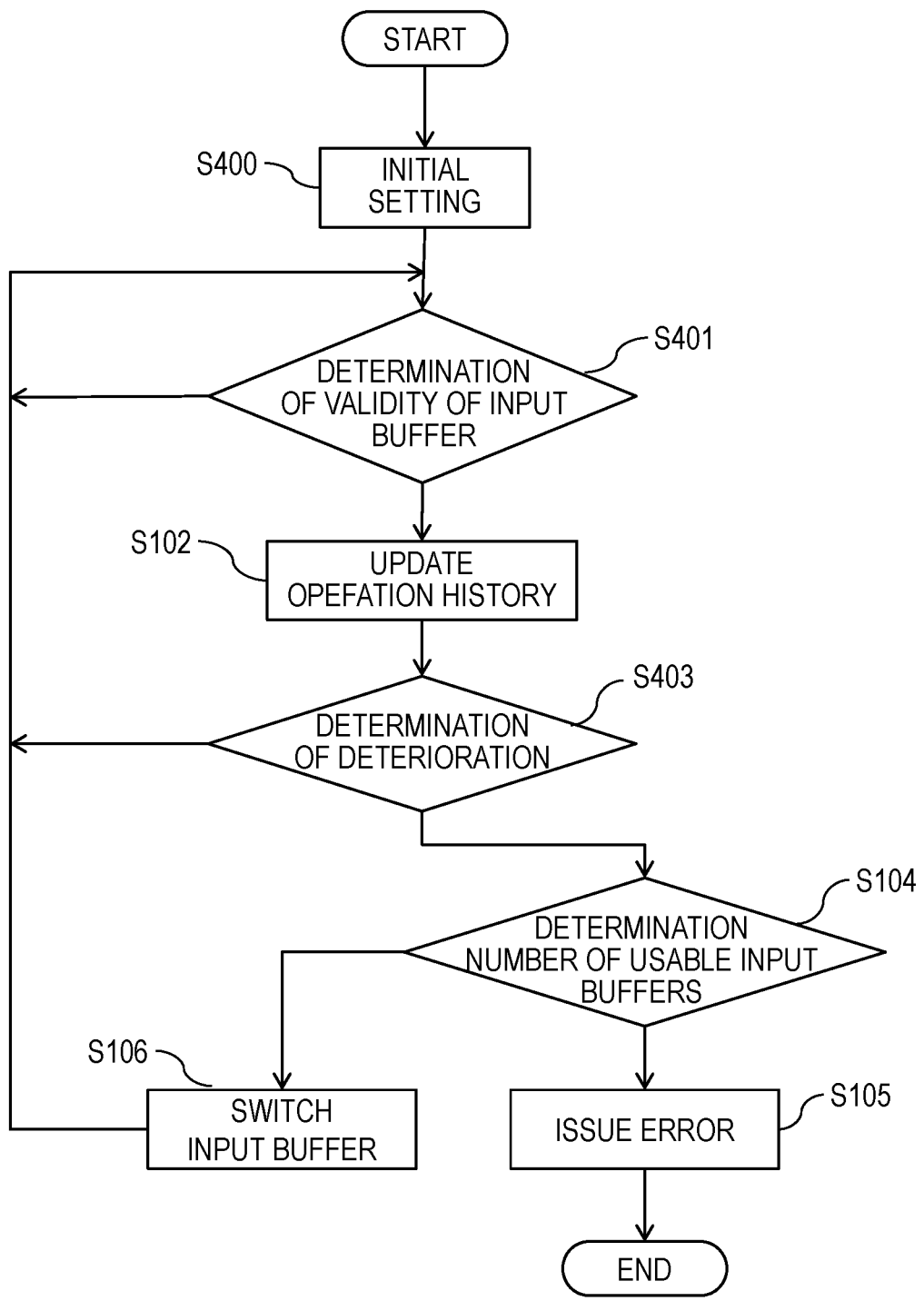
FIG. 13 is a flowchart showing an example of the operation of the microcontroller shown in FIG. 12.

Next, an operation related to the control of the input buffer deterioration diagnosis in the microcontroller 1d will be described with reference to FIG. 13. FIG. 13 is a flowchart showing an example of the operation of the microcontroller shown in FIG. 12.

Since the input buffer degradation diagnoses in the microcontroller 1d are the same as those in the first example except for the steps S400-S403, descriptions thereof are omitted.

(Initial Setting: S400)

The control circuit 31 sets the deterioration threshold value, the input enable time up to the previous time, the output duty ratio of the input buffer, and the number of usable input buffers. Since the input enable time, the output duty ratio of the input buffer, and the number of usable input buffers vary depending on the result of the deterioration diagnosis, the control circuit 31 stores them in the nonvolatile memory, and reads and sets them at the time of startup or the like.

(Determination of the Validity of Input Buffer Input: S401)

The control circuit 31 determines whether or not the input enable signal is activated and the input buffer 11 is valid. When the input buffer 11 is valid, the processing shifts to the step S402. When the input buffer 11 is invalid, the processing repeats the step S401.

(Updating the Operation History: S402)

The monitor circuit 39 monitors the output duty ratio of the input buffer 11 and outputs it to the control circuit 31. The control circuit 31 updates the accumulated input enable time and the output duty ratio.

(Determination of Deterioration: S403)

Based on the input enable time and the output duty ratio of the input buffer which are updated in step S402, the control circuit 31 determines whether the accumulated time of H level or L level supplied to the input terminal of the input buffer 11 exceed the deterioration thresholds. If it exceeds the degradation threshold, the processing advances to the step S104. Further, if it does not exceed the degradation threshold, the processing advances to the step S401.

In the fourth example, the deterioration determination is performed based on the accumulated data of the operation states of the input buffers instead of the self-diagnosis result as in the first to the third examples. Therefore, the circuit area can be reduced because the circuit related to self-diagnosis is unnecessary.

Fifth Example

Figure 14:
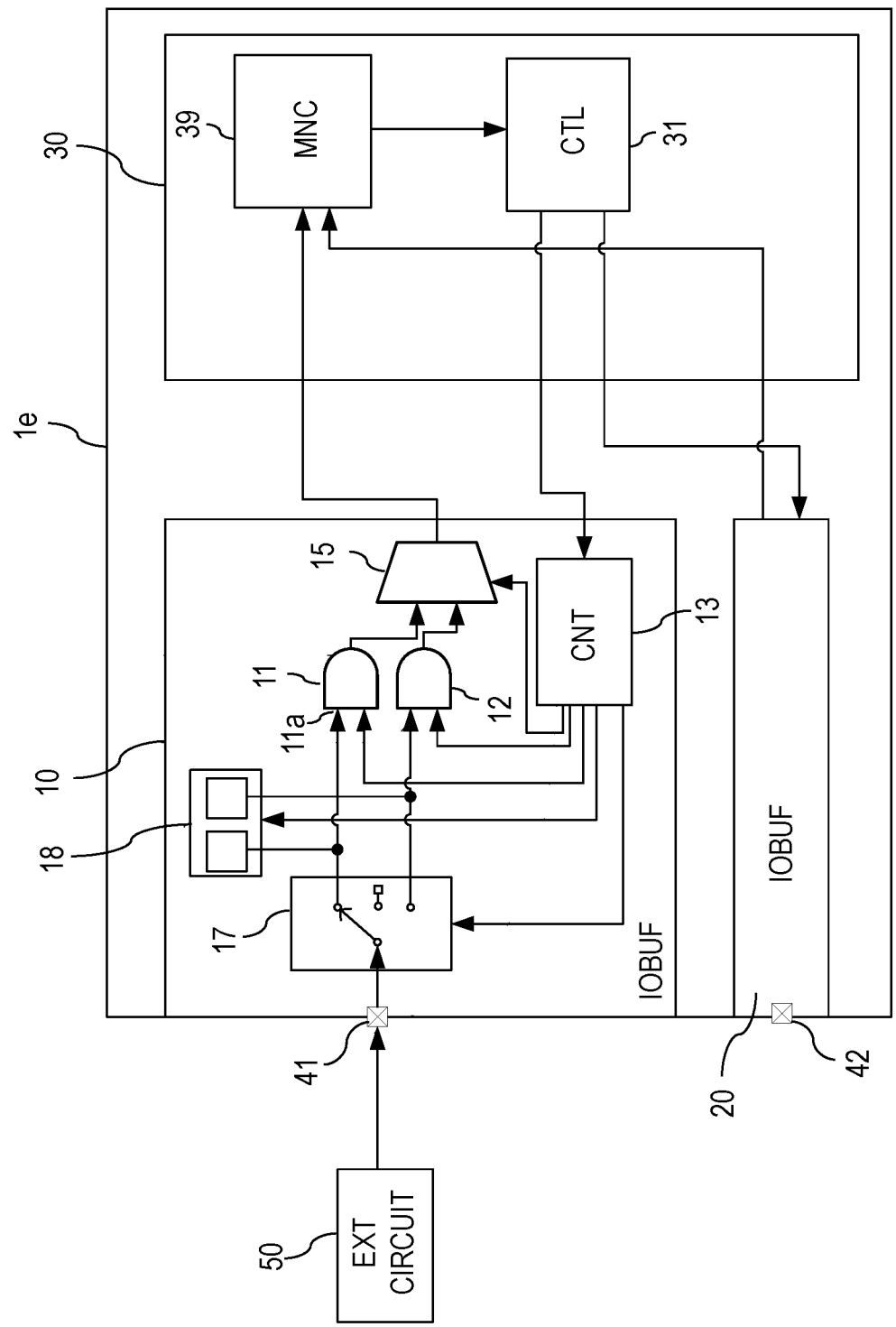
FIG. 14 is a diagram showing the configuration of the microcontroller in the fifth example.

The configuration of the microcontroller, the I/O buffers, and the operation of the diagnostic circuits in the fifth example will be described with reference to FIG. 14. FIG. 14 is a diagram showing the configuration of the microcontroller in the fifth example.

The microcontroller 1e in the fifth example, in addition to the configuration of the fourth example, it has a switch 17 and a refresh circuit 18 in the IO-buffer similarly to the second example. Hereinafter, differences from the fourth example will be described, and descriptions of the same points as those of the fourth example will be omitted.

The IO buffer 10 includes redundant input buffers 11 and 12, a control circuit 13, a multiplexer 15, a refresh circuit 18, and a switch 17. For example, when refreshing the input buffer 11, the control circuit 13 disconnects the external terminal 41 and the input terminal 11a of the input buffer 11 by the switch 17.

The control circuit 31 calculates the accumulated time of L level or the accumulated time of H level of the input signal in the input buffer 11 based on the accumulated input enable time and the output duty ratio. When the accumulated time of H level of the input signal or the accumulated time of L level of the input signal exceed the preset threshold (refresh threshold), the control circuit 31 issues an operation instruction for the refresh circuit 18 to the control circuit 13 in IO buffer 10. For example, if the duty ratio is large and the accumulated time of H level of the input signal exceeds the threshold, the control circuit 31 inputs the L level to the input terminal 11a of the input buffer 11 from the refresh circuit 18 via the control circuit 13. If the duty ratio is small and the accumulated time of L level of the input signal exceeds the threshold of the time of the L level of the input signal, the control circuit 31 inputs the H level to the input terminal 11a of the input buffer 11 from the refresh circuit 18 via the control circuit 13.

Further, if the accumulated time exceeds the degradation threshold set in advance, the control circuit 31 determines that the refresh operation is not necessary because the input buffer 11 has deteriorated. Then, the control circuit 31 issues a control signal to the control circuit 13 of the IO buffer 10 in order to use the input buffer 12.

Figure 15:
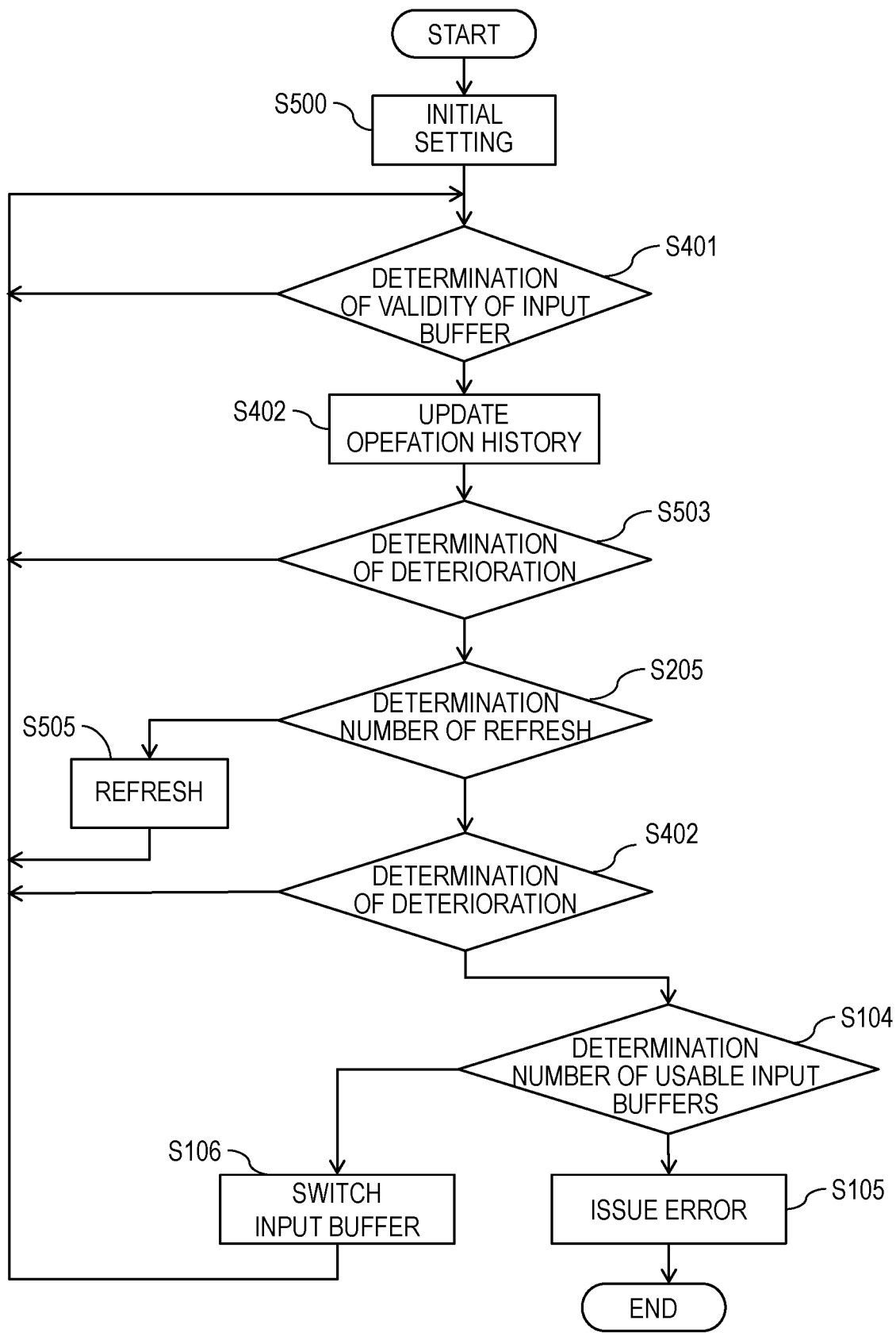
FIG. 15 is a flowchart showing an example of the operation of the microcontroller shown in FIG. 14.

Next, an operation related to the control of the input buffer degradation diagnosis in the microcontroller 1e will be described. FIG. 15 is a flowchart showing an example of the microcontroller operation shown in FIG. 14.

The input buffer degradation diagnoses in the microcontroller 1e are the same as those in the fourth example except for the steps S500, S503 and S505, although the destinations of the transitions are different, and therefore the description thereof is omitted.

(Step S500)

The control circuit 31 sets the refresh threshold and the deterioration threshold, the input enable time up to the previous time, the duty ratio, the remaining number of usable input buffers, the number of refreshes, and the upper limit of the number of refreshes. Since the input enable time, the output duty ratio of the input buffer, the number of refreshes, and the remaining number of usable input buffers vary depending on the result of the deterioration diagnosis, the control circuit 31 stores them in the nonvolatile memory, and reads and sets them at the time of startup or the like.

(Step S503)

Based on the input enable time and the duty ratio updated in the step S402, the control circuit 31 determines whether the time of H level or the time of L level supplied to the input terminal of the input buffer 11 exceed the refresh threshold. When the control circuit 31 determines the time exceeds the refresh threshold, the processing advances to the step S205. When the control circuit 31 determines the time does not exceed the refresh threshold, the processing returns to the step S401.

(Step S505)

The control circuit 31 disconnects the input terminal 11a of the input buffer 11 as an input buffer to be refreshed and the external terminal 41 by using the switch 17. Further, the refresh circuit 18 is activated to refresh the input buffer 11. In addition, the control circuit 31 increases the number of refreshes by one. After the refresh is completed, the processing returns to the step S401.

In the fifth example, by using the refresh circuit 18 in addition to the fourth example, the deterioration of the input buffers can be recovered and reused.

Although the present disclosure has been specifically described based on the embodiments described above, the present disclosure is not limited to the embodiments, and it is needless to say that various modifications can be made without departing from the gist thereof.

For example, in the embodiments and examples, the input buffer has been described using an AND circuit or the like for outputting a non-inverting level with respect to the input level, may be constituted by a NAND circuit or a NOR circuit or the like for outputting an inverting level with respect to the input level.

Further, although, in the first example and the second example, an example of providing a D/A converter has been described, the D/A converter may be replaced by the combination of the output buffer, pull-up circuit and the pull-down circuit in the IO buffer.

In the second example, the third example, and the fifth example, examples in which a refresh circuit is provided have been described, but the refresh circuit may be replaced with the combination of an output buffer, a pull-up circuit and a pull-down circuit in the I/O buffer.

The D/A converter 32a may diagnose the output voltage by using the microcontroller 1a or an A/D converter provided outside.

Further, in the embodiments and examples, the examples of the deterioration threshold value exceeding the deterioration threshold value of the VIH and the deterioration determination threshold value less than the deterioration threshold value of the VIL have been described, but the diagnoses may be performed using the lower limit threshold value of the VIH, the upper limit threshold value of the VIL, or the threshold value of VIH-VIL Schmitt level.

What is claimed is:

1. A semiconductor device comprising:
an external terminal;
an input buffer having an input terminal connected to the external terminal;
a voltage generating circuit configured to generate a test voltage supplied to the input terminal;
a control circuit configured to determine whether the input buffer is deteriorated based on the test voltage supplied to the input terminal and an output level of the input buffer responding to the test voltage; and
a refresh circuit configured to supply a refresh voltage which is high level or low level to the input terminal of the input buffer,
wherein, when the control circuit determines that the input buffer is deteriorated, the control circuit is configured to control to disconnect the input terminal from the external terminal and to supply the refresh voltage to the input terminal from the refresh circuit.

2. The semiconductor device according to claim 1,
wherein the input buffer is a first input buffer,
wherein the semiconductor device further comprises a second input buffer having an input terminal connected to the external terminal, and
wherein, when the control circuit determines that the first input buffer is deteriorated, the control circuit is configured to control to disconnect the input terminal of the first input buffer from the external terminal and to connect the input terminal of the second input buffer to the external terminal.

3. The semiconductor device according to claim 1, wherein the voltage generating circuit is a digital to analog converter.

4. The semiconductor device according to claim 1, wherein the voltage generating circuit includes a pulse generating circuit and an integrating circuit.

5. A semiconductor device comprising:
an external terminal;
an input buffer having a first input terminal which is connected to the external terminal and a second input terminal to which an input enable signal is input;
a monitor circuit configured to monitor an output duty ratio of the input buffer; and
a control circuit configured to calculate an accumulated time of high level of a signal being input to the first input terminal or an accumulated time of low level of the signal, based on the time during which the input enable signal is activated and the output duty ratio, and determine whether the input buffer is deteriorated based on the calculation result.

6. The semiconductor device according to claim 5, further comprising:
a refresh circuit configured to supply a refresh voltage which is high level or low level to the input terminal of the input buffer,
wherein, when the control circuit determines that the input buffer is deteriorated, the control circuit is configured to control to disconnect the first input terminal from the external terminal and to supply the refresh voltage to the first input terminal from the refresh circuit.

7. The semiconductor device according to claim 6, wherein the input buffer is a first input buffer,
wherein the semiconductor device further comprises a second input buffer having an input terminal connected to the external terminal, and
wherein, when the control circuit determines that the first input buffer is deteriorated, the control circuit is configured to control to disconnect the input terminal of the first input buffer from the external terminal and to connect the input terminal of the second input buffer to the external terminal.

8. A self-diagnostic method of a semiconductor device, the self-diagnostic method comprising:
monitoring an output duty ratio of an input buffer having a first input terminal which is connected to an external terminal and a second input terminal to which an input enable signal is input;
calculating an accumulated time of high level of a signal being input to the first input terminal or an accumulated time of low level of the signal based on the time during which the input enable signal is activated and the output duty ratio; and
determining whether the input buffer is deteriorated based on calculation result.

9. The self-diagnostic method according to claim 8, further comprising:
disconnecting the first input terminal of the input buffer from the external terminal and then supplying a refresh voltage which is high level or low level to the first input terminal of the input buffer, when it is determined that the input buffer is deteriorated.

10. The self-diagnostic method according to claim 9, further comprising:
disconnecting the first input terminal of the input buffer from the external terminal and then connecting the second input terminal of the input buffer to the external terminal, when it is determined that the input buffer is deteriorated.

* * * * *